US 6,549,548 B2

(12) United States Patent
Kuznetsov et al.

(10) Patent No.: US 6,549,548 B2
(45) Date of Patent: *Apr. 15, 2003

(54) INTERFEROMETRIC FILTER WAVELENGTH METER AND CONTROLLER (75) Inventors: Mark E. Kuznetsov, Lexington, MA (US); Peter S. Whitney, Lexington, MA (US); Dale C. Flanders, Lexington, MA (US)

(73) Assignee: Axsun Technologies, Inc., Billerica, MA (US)

(*) Notice: Subject to any disclaimer, the term of this patent is extended or adjusted under 35 U.S.C. 154(b) by 200 days.

This patent is subject to a terminal disclaimer.

(21) Appl. No.: 09/768,082

(22) Filed: Jan. 23, 2001

(65) Prior Publication Data
US 2003/0021308 A1 Jan. 30, 2003

Related U.S. Application Data (63) Continuation-in-part of application No. 09/696,388, filed on Oct. 25, 2000, now Pat. No. 6,366,592.

(51) Int. Cl.[7] ................................................. H61S 3/13
(52) U.S. Cl. ............................................. 372/32; 372/98
(58) Field of Search ..................................... 372/32, 98

(56) References Cited

U.S. PATENT DOCUMENTS

| 4,017,807 A | 4/1977 | Hutcheson et al. ........ 331/94.5 |
| 4,272,733 A | 6/1981 | Walling et al. ............. 331/94.5 |
| 4,822,998 A | 4/1989 | Yokota et al. ............... 250/226 |
| 5,144,498 A | 9/1992 | Vincent ....................... 359/885 |
| 5,666,225 A * | 9/1997 | Colbourne ..................... 372/32 |
| 5,949,801 A * | 9/1999 | Tayebati ....................... 372/20 |
| 6,366,592 B1 * | 4/2000 | Flanders ....................... 372/18 |
| 6,122,301 A * | 9/2000 | Tei et al. ...................... 372/32 |
| 6,175,432 B1 | 1/2001 | Wu et al. ..................... 359/124 |

FOREIGN PATENT DOCUMENTS

| EP | 0 875 743 A1 | 11/1998 | ............. G01J/9/02 |
| EP | 1 052 484 A2 | 11/2000 | ............. G01J/3/26 |
| EP | 1 052 526 A2 | 11/2000 | ............. G02B/5/20 |
| WO | 01/20371 | 3/2001 | |

* cited by examiner

Primary Examiner—Leon Scott, Jr.
(74) Attorney, Agent, or Firm—J. Grant Houston (57) ABSTRACT A wavelength measurement system uses birefringent material waveplate, thereby producing a substantially sinusoidal spectral response. As a result, the responses of multiple birefringent filters can be combined to yield a filter system with a periodic frequency response that has an additive wavelength resolution that is spectrally stable. That is, the wavelength measurement system does not have regions where wavelength resolution is degraded. In one implementation, a waveplate system 112 is used, placed between two blocks of birefringent material 110 and 114. A quadrant detector 116 is used to detect the intensities of the resulting four beams.

25 Claims, 9 Drawing Sheets

DIFFERENT THICKNESSES

FIG.7

DIFFERENT ANGLES

DIFFERENT ANGLES/DOUBLE THICKNESS
FIG.10

INTERFEROMETRIC FILTER WAVELENGTH METER AND CONTROLLER

RELATED APPLICATION

This application is a Continuation-in-Part of U.S. application Ser. No. 09/696,388, filed on Oct. 25, 2000 now U.S. Pat. No. 6,366,592, the entire teachings of which are incorporated herein by this reference in their entirety.

BACKGROUND OF THE INVENTION

Wavelength division multiplexing (WDM) systems typically comprise multiple separately modulated laser systems at the transmitter. These laser systems are designed or actively tuned to operate at different wavelengths. When their emissions are combined in an optical fiber, the resulting WDM optical signal has a corresponding number of spectrally separated channels. Along the transmission link, the channels are typically collectively amplified in semiconductor amplifier systems or gain fiber, such as erbium-doped fiber and/or regular fiber, in a Raman amplification scheme. At the receiving end, the channels are usually separated from each other using, for example, thin film filter systems to thereby enable detection by separate detectors, such as photodiodes.

The advantage of WDM systems is that the transmission capacity of a single fiber can be increased. Historically, only a single data channel was transmitted in each optical fiber. In contrast, modem WDM systems contemplate hundreds of spectrally separated channels per fiber. This yields concomitant increases in the data rate capabilities of each fiber. Moreover, the cost per bit of data in WDM systems is typically less than comparative non-multiplexed systems. This is because optical amplification systems required along the link are amortized across all of the separate wavelength channels transmitted in the fiber. With non-multiplexed systems, each channel/fiber would require its own amplification system. As an additional functionality, different wavelengths in WDM optical networks can also be used for wavelength routing of optical signals. This is sometimes referred to as metro WDM.

Nonetheless, there are challenges associated with implementing WDM systems. First, the transmitters and receivers are substantially more complex since, in addition to the laser diodes and receivers, optical components are required to combine or multiplex, the channels into, and separate, or demultiplex, the channels from, the WDM optical signal. Moreover, there is the danger of channel drift, where the channels lose their spectral separation and thus overlap each other. This interferes with channel demodulation at the receiving end.

Minimally, the optical signal generators, e.g. the semiconductor laser systems that generate each of the optical signals corresponding to the optical channels for a fiber link, must have some provision for wavelength or frequency control. Generated and transmitted optical channel wavelength should be controlled to within a fraction of the channel wavelength spacing. Especially in systems with center-to-center channel wavelength spacings of less than 1 nanometer (nm), the optical signal generator must have a precisely controlled carrier wavelength. Any transmitted wavelength wander impairs the demodulation of the wandering signal at the far end receiver, since the wavelength is now different from that expected by the corresponding optical demultiplexer and signal detector. The wandering wavelength signal can have decreased power in its intended receiver; it can also interfere with and impair the demodulation of spectrally adjacent channels when their spectrums overlap each other.

Frequency/wavelength lockers are typically used in semiconductor based laser systems to detect the wavelength of operation of the laser relative to the intended ITU grid channel center, for example, and then generate a feedback signal that can be used as a tuning signal to control the laser's wavelength of operation. Typically, lockers are used to stabilize the operating wavelength of the semiconductor laser either to a single channel wavelength, or they can allow the laser to hop between operational channel wavelengths.

Lockers have been proposed that are based on etalons. Typically, the thickness of the etalons must be controlled to define the locker's frequency locking range and the spacing of the frequency locked channels, which is given by the etalon free spectral range (FSR). Further, the etalons reflectivities must be controlled in order to achieve the desired amount of wavelength discrimination.

SUMMARY OF THE INVENTION

One of the problems associated with etalon-based lockers, however, surrounds manufacturability. The thickness of the etalon must be controlled to absolute tolerances to control FSR and to align etalon resonances precisely with the standard channel frequencies, with some adjustment allowed by angle tuning. Moreover, the reflectivities must be selected and controlled to achieve the desired level of discrimination. Further, it is not uncommon in these locker systems to use multiple etalons. The thicknesses of these etalons and their reflectivities must also be controlled, typically, on a relative basis.

A further problem arises with the basic filtering characteristic of etalons. Generally, an etalon's frequency response is defined according to the function $(1+\sin^2 x)^{-1}$. Within a period of operation of the etalon, the filtering characteristic appears as a bandpass filter. Such devices provide good discrimination on either side of the center bandpass frequency where large changes in transmission result from changes in input optical frequency. However, these devices perform relatively poorly when transmission slope with frequency is low, which is the case near the peaks and broad valleys of the filter transmission function. This can become a problem when wavelength control is required over a relatively large band, as required in some tunable laser systems, such as those used in wavelength division multiplexing systems.

Some have proposed etalon-based systems that have wider bandwidths of operation. This can be achieved by one of two approaches. First, multiple etalons can be used. The problem here, however, is that these multiple etalons must be manufactured with close tolerances relative to each other. Alternatively, low-finesse etalons can be used, thereby providing transmission changes over a wider frequency range. The problem arises, however, that contrast is poor in such low finesse devices. Another disadvantage and strong limitation of etalon lockers is that while they lock the laser frequency near one of the periodic etalon resonances corresponding to the frequency grid channels, they provide no information whatsoever as to which particular channel on the grid the laser is locked to.

These problems with conventional etalon lockers create problems with newer dense WDM (DWDM) systems. The channel frequency spacing can be tight, 100 GigaHertz (GHz) to as tight as 50 GHz and 25 GHz in some currently proposed systems. Further, the number of potential channels on a link can be large. Observation of the ITU frequency grid suggests 100's of channels on a link in the $L_\alpha$, $C_\alpha$, and $S_\alpha$ bands, even if the 50 GHz offset of the $L_\beta$, $C_\beta$, and $S_\beta$ band is ignored.

The present invention is directed to wavelength measurement and control system that is based upon a Mach-Zehnder type, or interferometric, filter made using birefringent material, in the preferred implementation. The advantage of this birefringent material filter is that it has a substantially sinusoidal spectral response. As a result, the responses of multiple birefringent filters can be combined to yield a filter system that has an additive wavelength resolution that is uniform and spectrally stable for all wavelengths. That is, the wavelength measurement and control system does not have regions where wavelength resolution is degraded.

In general, according to one aspect, the invention features a wavelength measurement system. This system comprises a birefringent, waveplate, filter system that applies multiple spectral filtering characteristics to an input beam. Multiple detectors are used to detect the beam after being filtered by the multiple spectral filtering characteristics. Finally, a controller determines the wavelength of the input beam in response to the relative responses of the multiple detectors.

Preferably, the birefringent filter system comprises several blocks of birefringent material with different functions. In one implementation, it comprises birefringent waveplates placed between two blocks of birefringent polarizing beam splitters. Specifically, two waveplates are used in parallel to each other between the birefringent displacer/polarizer material blocks.

In general, according to another aspect, the invention also features a semiconductor laser system with wavelength control. This system comprises a semiconductor laser system that generates a polarized output beam. A wavelength detection system, on the output of the laser, comprises a birefringent filter system and multiple detectors for detecting the beam after being filtered by multiple spectral filtering characteristics of the filter system. A controller adjusts the wavelength of operation of the semiconductor laser system in response to the responses from the multiple detectors.

A feature of some embodiments of this invention concerns the fact that, generally, the birefringent filter systems, while being simple, are typically sensitive to the polarization of the input light. Semiconductor lasers typically produce polarized light as an artifact of their construction; also, polarized light from such lasers is typically required for polarization sensitive external modulators, such as lithium niobate modulators. Depending on the selected tensile or compressive strain characteristics of the semiconductor epitaxial material, the polarization of the light from the laser system is specified. Thus, the precondition of known polarization is provided as a consequence of using the semiconductor laser system.

In general, according to still another aspect, the invention features a wavelength detection system. This wavelength detection system comprises a filter system that provides multiple spectral filtering characteristics to an input beam. These multiple filtering spectral characteristics preferably have a spectrally stable additive wavelength resolution. The advantage of such a stable additive wavelength resolution is the fact that the system can resolve wavelengths across some spectral band with consistent accuracy. Multiple detectors are then used to detect the beam after being filtered by the multiple spectral filtering characteristics.

An important advantage of the present invention is that optical frequency measurement is periodic with the input optical frequency; the measurement period being given by the constituent filter free spectral range. This frequency measurement range can be chosen to be the full optical band of interest, such as the C band, or only a fraction thereof. For a particular frequency meter in accordance with the present invention, frequency measurement has a constant, or near constant, frequency resolution over the full free spectral range; in addition, center frequency of this measurement range can be chosen arbitrarily. Therefore, the same device, perhaps with adjusted software calibration, can be used in the C, L, S or other optical communications wavelength band. Also, for a continuously tuned laser source, such a frequency meter can track the source optical frequency over an arbitrarily wide frequency range through the multiple periods of the meter response. Importantly, frequency meter and controller in accordance with the present invention can measure and lock a laser to an arbitrary frequency over the device measurement range. Unlike other etalon based wavelength lockers, our device is not limited to a predetermined fixed grid of equally-spaced frequencies.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1A:
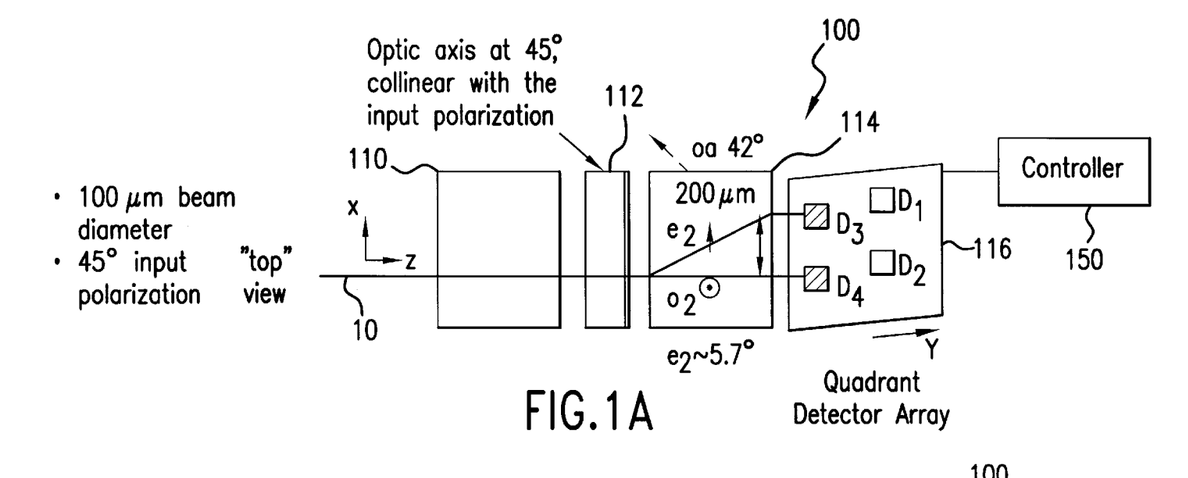
FIG. 1A is a top view of a wavelength measurement system according to the present invention.
Figure 1B:
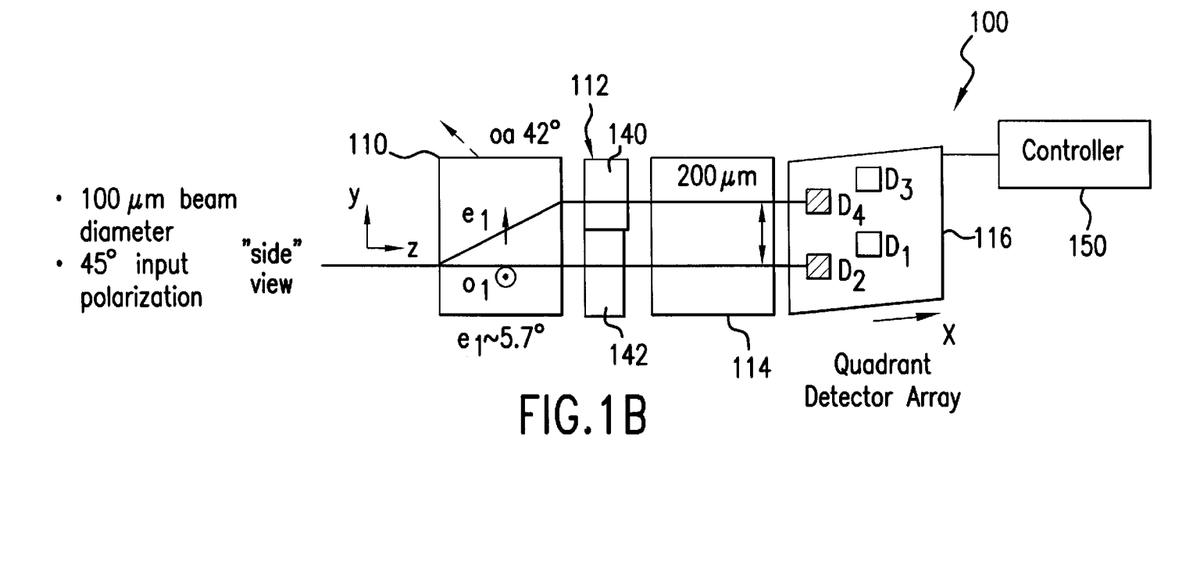
FIG. 1B is a side view of the inventive wavelength measurement system.

FIGS. 1A and 1B are top and side views of a wavelength detection system, which has been constructed according to the principles of the present invention.

Generally, the wavelength measurement system 100 comprises a first birefringent block 110, which acts as a beam splitter/displacer. Optically after the birefringent block 110, a birefringent waveplate system 112 is provided along the direction of optical signal propagation. After the waveplate system 112, a second birefringent block 114 is provided, which acts as a polarizing beam splitter. Finally, the filtered optical signals are then detected by a detector array 116, such as a quadrant detector.

In operation, an input beam 10 first enters the first birefringent block 110. The optical axis (oa) of the first birefringent beam displacer block 110 is oriented at ~42° relative to the incoming beam direction. As a result, in the Y-Z plane of FIG. 1B, the input beam is divided into two orthogonally polarized beams $e_1$ and $o_1$ due to the walk-off or beam displacement operation of the first birefringent block 110 on input beam 10. Input beam is polarized at ~45° to the X and Y axes.

In the illustrated embodiment, the input beam diameter is approximately 100 micrometers. The first birefringent block 110 has a length of approximately 2 millimeters (mm), and the birefringent material can be yttrium orthovanadate ($YVO_4$), for example.

The two beams $e_1$ and $o_1$ generated by the first birefringent block 110 exit the first birefringent block and enter the waveplate system 112. In the preferred embodiment, the waveplate system 112 comprises either two separate waveplates 140, 142 or a single waveplate with a fabricated thickness step. The waveplate optical axis is at ~45° to the X and Y axes, and is collinear with or perpendicular to the polarization of input beam 10. The waveplates 140, 142 have different thicknesses relative to each other. In the illustrated embodiment, beam $e_1$ enters the waveplate 140; the second beam $o_1$ enters the second waveplate 142.

Specifically, in one implementation using Yttrium Orthovanadate $YVO_4$ birefringent material, the bulk thickness of the two waveplates is ~290 micrometers on an absolute basis, but the two have a thickness difference of approximately 1.9 micrometers on a relative basis. The waveplate absolute thickness defines the filter free spectral range, designed in this case to be ~5 TeraHertz (THz), while the thickness difference is designed to shift the sinusoidal filter responses by approximately a quarter period.

The two beams $e_1$ and $o_1$ exit the waveplate system 112 and enter the second birefringent block 114. This block 114 functions as a polarizing beam splitter. As illustrated in FIG. 1A, it provides beam displacement in the direction of the X-axis. As a result, four separate beams are now generated at the output facet of the second birefringent block 114: $e_1$, $e_2$, $o_1$, $o_2$.

The separate output beams are detected by the detection elements $d_1$–$d_4$ of a quadrant detector array 116.

In one embodiment, the second birefringent block 114 is ~2.0 mm in length and has an optical axis (oa) angled at ~42° to the incoming beam direction. This block 114 can be identical to the block 110, except for rotation by 90° about the Z axis. The pitch of the quadrant detector array 116 is less than approximately 400 micrometers, more specifically it can be about 200 micrometers in both the X and Y axis directions. The beam diameters at the detectors are 110 micrometers.

In the preferred embodiment, the crystal used for the birefringent blocks 110, 114 is yttrium orthovanadate $YVO_4$. For this crystal, $n_e$ is 2.1486 and $n_o$ is 1.9447 at 1550 nm.

The overall length of the birefringent filter system 100 is approximately 4.3 mm. This short length enables compact implementation in standard-sized butterfly packages.

Figure 2:
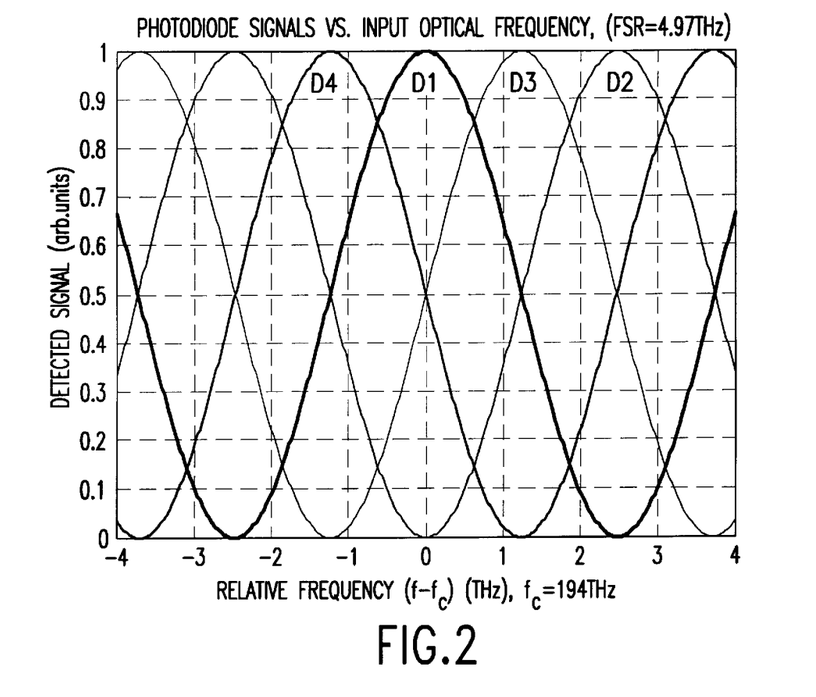
FIG. 2 is a plot of the detected signals (arbitrary units) as a function of relative optical frequency for detectors D1–D4.

FIG. 2 is a plot of the detected signal from detection elements $d_1$–$d_4$ of the quad detector 116 as a function of the relative input optical frequency with a nominal center frequency of $f_c$=195 THz. Each detector response is a generally sinusoidal spectral function. The sinusoid period is given by the filter free spectral range $f_{FSR}$, and is defined by the waveplate bulk thickness L, the material refractive index difference between the extraordinary and ordinary axes $\Delta n_{eo}$, and the speed of light c:

$$f_{FSR} = \frac{c}{\Delta n_{eo} L}.$$

For a ~290 μm thick $YVO_4$ waveplate, the free spectral range is ~5 THz. The peaks of the detected signals are displaced spectrally with respect to each other across the free spectral range of the birefringent filter system 100, preferably evenly by a quarter period. The thickness difference $\Delta L$ of the two waveplates that produces the desired quarter period filter response shift is $$\Delta L = \frac{c}{4 f_c \Delta n_{eo}}$$

For the $YVO_4$ waveplate operating about $f_c$=195 THz, this thickness difference is ~1.9 μm.

The detector signals $D_1$ and $D_3$ have a sinusoidal frequency dependence and are shifted relative to each other by a quarter period. Plotting the signals $D_1$ and $D_3$ as a point in the $D_1$–$D_3$ plane, the plotted point moves uniformly with varying input optical frequency tracing a circle in this plane; the position on the circle is a measure of the input optical frequency. To provide input optical power normalization and to obtain the highest signal-to-noise ratio by utilizing all four detector output signals, we define two normalized signals $D_x$ and $D_y$:

$$D_x = \frac{D_1 - D_2}{D_1 + D_2} \qquad D_y = \frac{D_3 - D_4}{D_3 + D_4}$$

Figure 3:
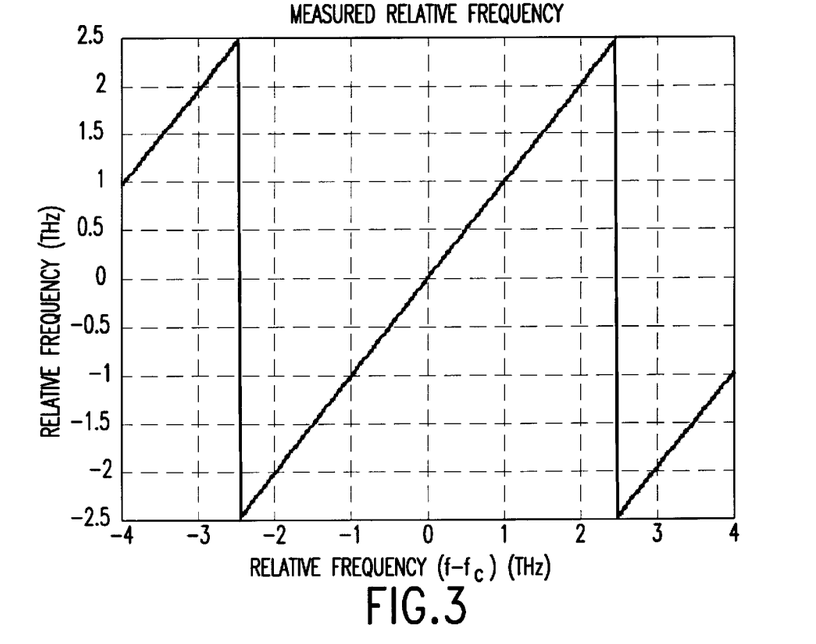
FIG. 3 is a plot of measured relative frequency as a function of relative input optical frequency for the inventive wavelength measurement system.

Under varying input optical frequency, the point $(D_x, D_y)$ in the $D_x$–$D_y$ plane moves around a circle of unity radius and centered at the origin. Relative measured optical frequency $f_{meas}$ can be obtained from the angle the vector $(D_x, D_y)$ forms with the $D_x$-axis:

$$f_{meas} = \frac{f_{FSR}}{2\pi} \text{atan2}(D_y, D_x)$$

where the generalized arctangent function atan2($D_y$, $D_x$) gives this angle with a periodicity of $2\pi$, and $f_{FSR}$ is the period or free spectral range of the measurement system. Therefore the controller 150 can resolve the frequency of the input optical beam by the simultaneous reference to the responses of each of the detector elements $d_1$–$d_4$ of the quad detector 116. The measured relative frequency $f_{meas}$ is plotted in FIG. 3 as a function of the relative input optical frequency. The frequency measurement is periodic with period $f_{FSR}$, the periodic frequency reset points can be shifted arbitrarily by a simple adjustment in the numerical algorithm above. Optical frequency discrimination of this measurement system is uniform for all input optical frequencies. The measured frequency resolution is determined by the signal-to-noise ratio of the detector outputs and, importantly, is independent of the input optical frequency. For small deviations of the thickness difference $\Delta L$ from its ideal value, the circle in the $D_x$–$D_y$ plane becomes an ellipse; this makes the frequency discrimination slightly non-uniform and is easily accommodated in the proposed measurement and control system by adjustment in device calibration.

Figure 4:
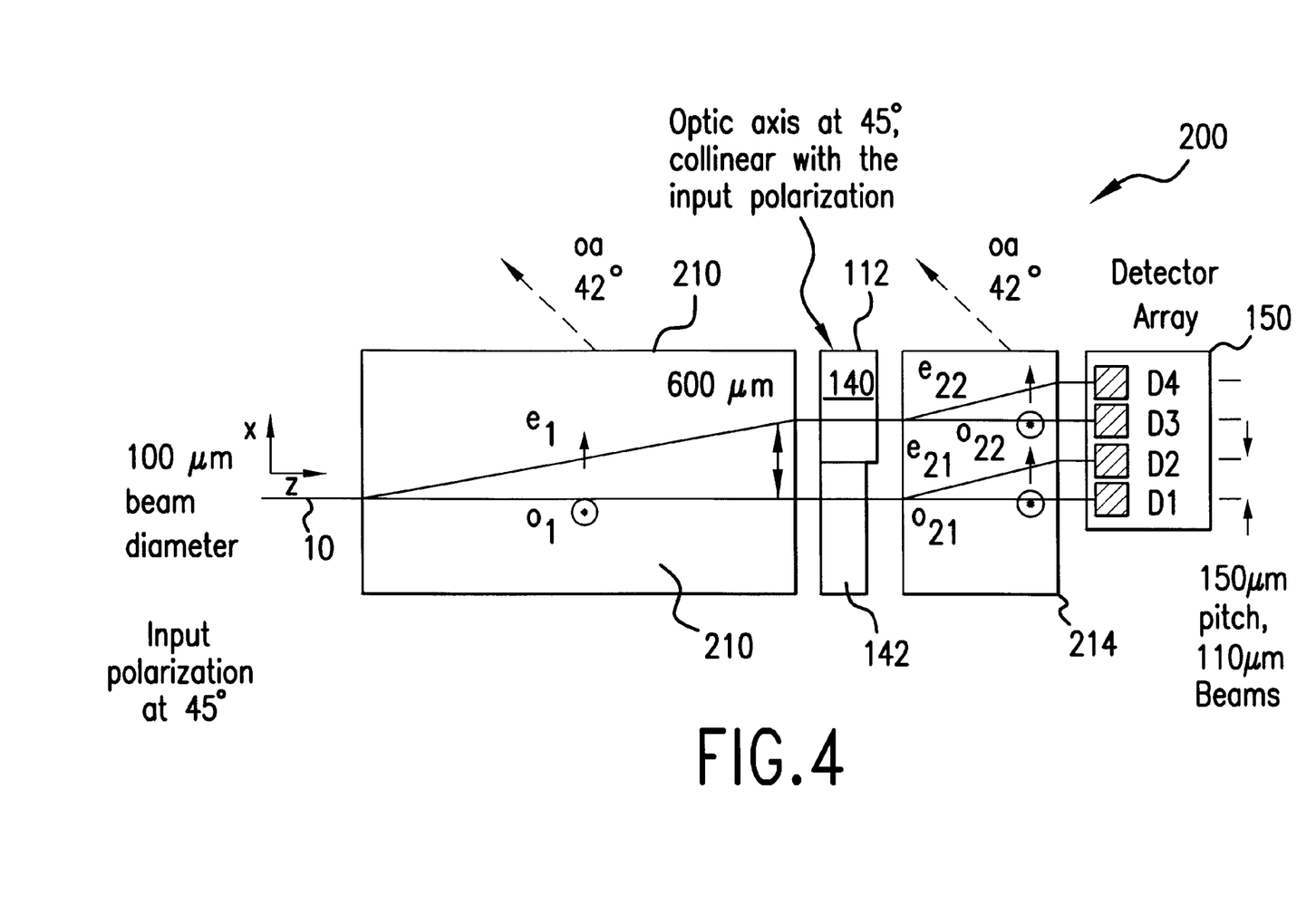
FIG. 4 is a block diagram of a second embodiment of the wavelength measurement system of the present invention.

FIG. 4 shows a second embodiment of a wavelength measurement system. The general difference between the first and second embodiments is the fact that the second embodiment uses a linear detector array rather than a quadrant detector array. Further, the second embodiment of FIG. 4 is somewhat less compact than the embodiment shown in FIGS. 1A and 1B.

In more detail, in the second embodiment, the input beam, with approximately 100 micrometer beam diameter, has an input polarization of ~45° in the X-Y plane. The first birefringent block 210 has an optical axis, which is angled at ~42 relative to the incoming beam direction. If the first birefringent block is approximately 3 mm in length, there is a resulting beam spacing of 300 micrometers between beam $e_1$ and beam $o_1$.

These two beams enter the waveplate system 112. In one implementation, these waveplates are approximately 294 micrometers in thickness and have a thickness difference of ~1.9 micrometers.

After the waveplates, the beams enter a second birefringent block 214. This birefringent block 214 has an optical axis (oa) that is angled at ~42° to the beam direction. This further displaces the input beams to thereby yield beams $e_{22}$, $o_{22}$, $e_{21}$, and $o_{21}$. These four beams are then detected by a linear detector array having elements $d_1$–$d_4$. In the illustrated implementation, the pitch between elements is approximately 150 micrometers, and the beams at the elements are approximately 110 micrometers in diameter.

The second birefringent block functioning as a beam displacer/polarizer has a length of ~1.5 mm. As a result, the total length of the birefringent filter system 200 is approximately 5 mm. An algorithm as described relative to FIGS. 2 and 3 is used by a controller 150 to resolve the frequency of the input beam 10.

Figure 5A:
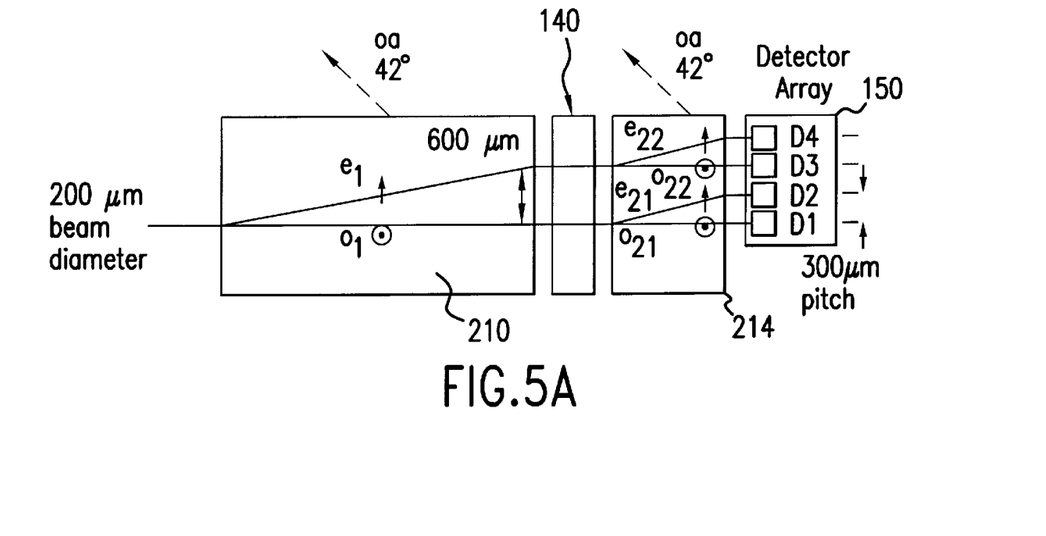
FIG. 5A is a block diagram of the third embodiment of the wavelength measurement system, with a polarization diversity scheme and a sinusoidal frequency discrimination function.

FIG. 5A shows an implementation of the third embodiment of the birefringent filter system. Here polarization diversity is used to obtain polarization independent operation of the frequency discriminator. For this implementation, the price one pays for polarization independence is that the frequency discrimination function is now sinusoidal, rather than piecewise linear as in FIG. 3 for the frequency measurement systems of FIGS. 1 and 4. This configuration can nevertheless be useful for some applications requiring polarization independence.

Specifically, polarizing beam splitter 210 spatially separates two orthogonal linear polarization components $e_1$ and $o_1$ of the incoming beam, which here can have an arbitrary polarization. Both polarization components $e_1$ and $o_1$ then pass through a single waveplate 140 and onto a second polarizing beam splitter 214. The second polarizing beam splitter 214 can have the same crystal orientation as the splitter 210 for use with a linear detector array; alternatively, the second splitter 214 can have have its orientation rotated by ~90° about the beam propagation z-axis for use with a quadrant detector array. The frequency discriminator signal $D_f$ is obtained from the signals of the four photodetectors $d_1$–$d_4$:

$$D_f = \frac{(D_1 + D_4) - (D_2 + D_3)}{(D_1 + D_4) + (D_2 + D_3)}$$

Figure 5B:
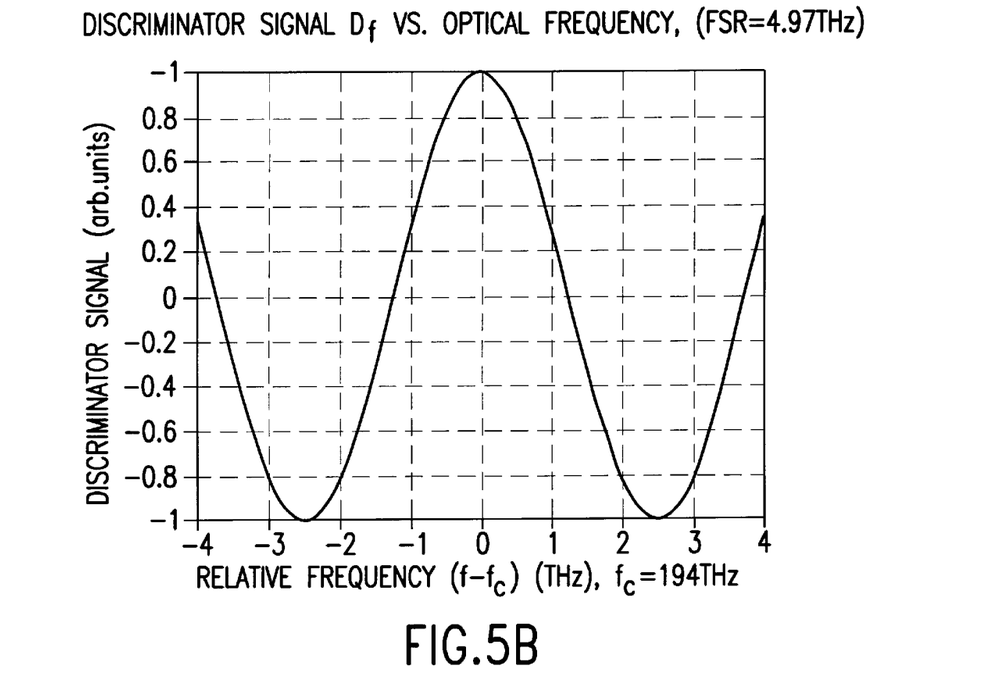
FIG. 5B is a plot of the detected, discrimination signal (arbitrary units) as a function of relative optical frequency for detectors D1–D4.

The discriminator signal varies sinusoidally with the input optical frequency, as shown in FIG. 5B; the measured optical frequency $f_{meas}$ can then be obtained from $$f_{meas} = \frac{f_{FSR}}{2\pi} a\cos(D_f)$$

The frequency measurement is periodic with the period given by the filter free spectral range $f_{FSR}$ $$f_{FSR} = \frac{c}{\Delta n_{eo} L}$$

which is determined by the waveplate 140 thickness L and its extraordinary-ordinary index difference $\Delta n_{eo}$. The implementation in FIG. 5A allows polarization independent frequency measurement with a periodic sinusoidal frequency discrimination function. Unlike implementations of FIGS. 1 and 4 which have a constant stable frequency resolution for all input optical frequencies, the implementation of FIG. 5A has "dead zones" near the peaks and valleys of the sinusoid where the discriminator derivative (or slope) is small and the device looses frequency resolution.

Figure 6:
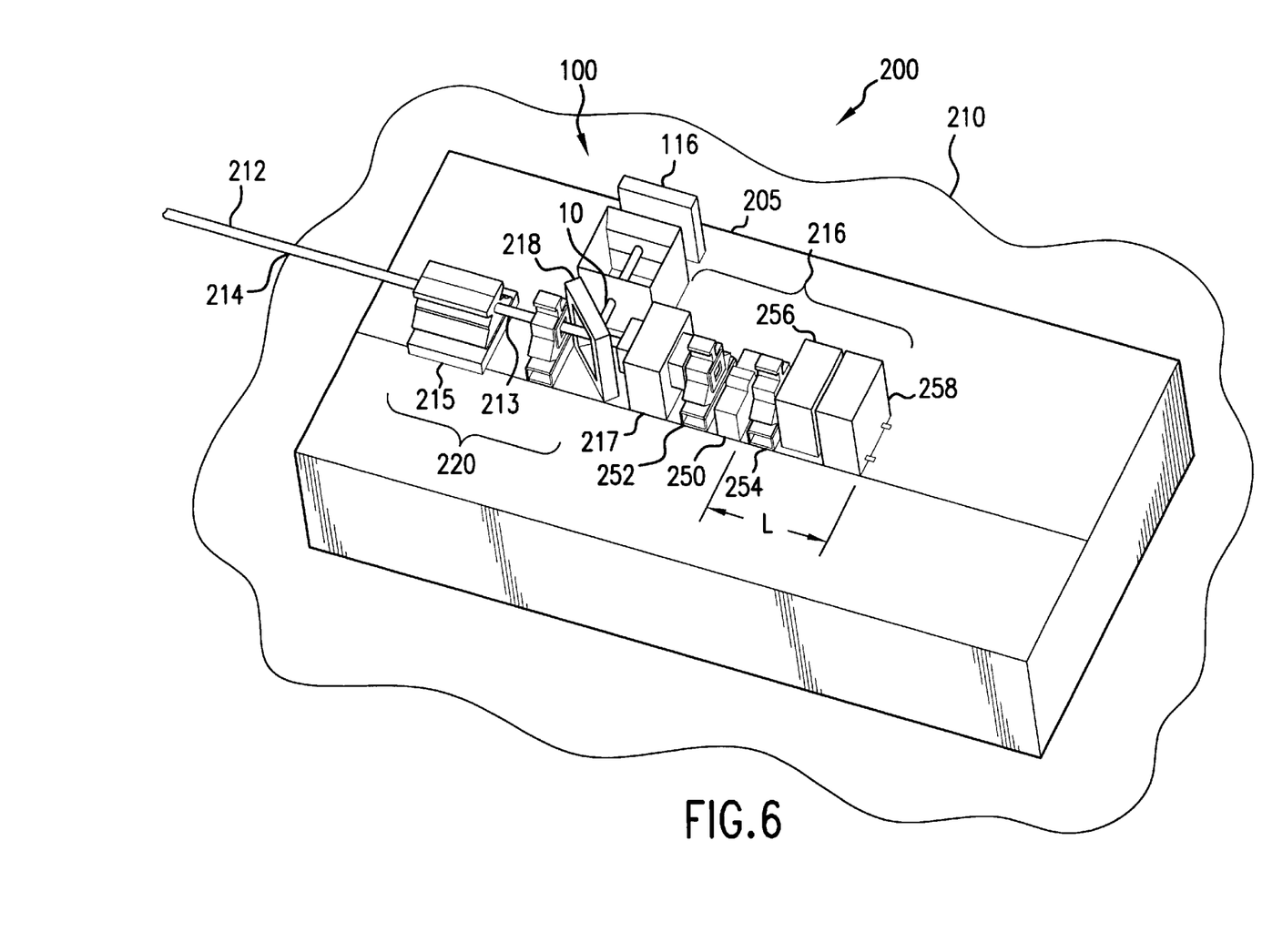
FIG. 6 is a semiconductor laser system integrated with the inventive wavelength measurement system to yield a tunable semiconductor laser system with integrated wavelength locker, according to the present invention.

FIG. 6 shows a tunable laser system 200 in which the inventive wavelength detection system is integrated, in one example.

Generally, the tunable laser system 200 comprises a hermetic package 210. Typically, this hermetic package is a standard pin package, such as a butterfly package or dual, in-line (DIP) package. Presently, a standard sized packaging platform is used, which has a hermetic cavity of less than 2.0 centimeters (about 0.75 inches) in length and less than 1.5 centimeters (cm) (approximately 0.5 inches) in width.

An optical bench or submount 205 is installed within the hermetic package 110. The optical components of the tunable laser system 200 are installed on this bench. In the preferred embodiment, the bench is constructed from a mechanically and temperature stable substance, such as aluminum nitride, silicon, silicon oxide, or beryllium oxide in various implementations. The bench is typically installed in the package on a thermoelectric cooler.

An optical fiber pigtail, such as a length of single mode optical fiber 212, enters the hermetic package 210 through a fiber feed-through 214. Typically, the pigtail 112 passes through a ferrule in the feed-through. In one implementation, single mode polarization-maintaining fiber is used.

The termination of the fiber pigtail 213 is installed or attached to the bench 205 using a fiber mounting and alignment structure 215. This mounting structure 215 connects the fiber pigtail 212 such that the endface 213 is secured in a rigid connection to the bench and supported above the bench. The optical signal is coupled into this fiber pigtail 212 via the fiber endface 213 and transmitted outside of the tunable laser system 210. Preferably, deformable mounting structures are used to enable active or passive alignment during system manufacture or calibration after an in-service period.

The optical components of the tunable laser system 100 are divided into three subsystems. The tunable semiconductor laser 216 generates the optical signal in the form of an output beam. Specifically, an amplifier 250 is installed between two focusing lenses 252, 254. A tunable filter 256 selects the wavelength of operation. A cavity length modulator controls the length of the laser cavity so that a cavity mode resides at the desired operational wavelength.

The wavelength detection system 100 functions as a locker subsystem to determine a wavelength of the optical signal using a portion light, preferably from the output beam, from the tunable laser 116, which is provided by beam splitter 218.

The output coupling section 220 couples the remainder, or main portion, of the optical signal beam into the fiber pigtail 212 for transmission out of the system 200.

An isolator 217 of the tunable laser 216 is preferably installed between the laser and the output coupling section 220/locker 100. This isolator prevents backreflections into the laser 116 to help stabilize its operation.

One advantage associated with the present invention is that it is relatively compact. One disadvantage is its polarization sensitivity. When the locker system, however, is integrated with a semiconductor laser system, this polarization dependency does not complicate the overall operation and complexity of the system since the polarization of the semiconductor laser systems are typically known and invariant. Thus, the reliance of the inventive wavelength measurement system on the polarization of the input light does not increase overall complexity.

Figure 7:
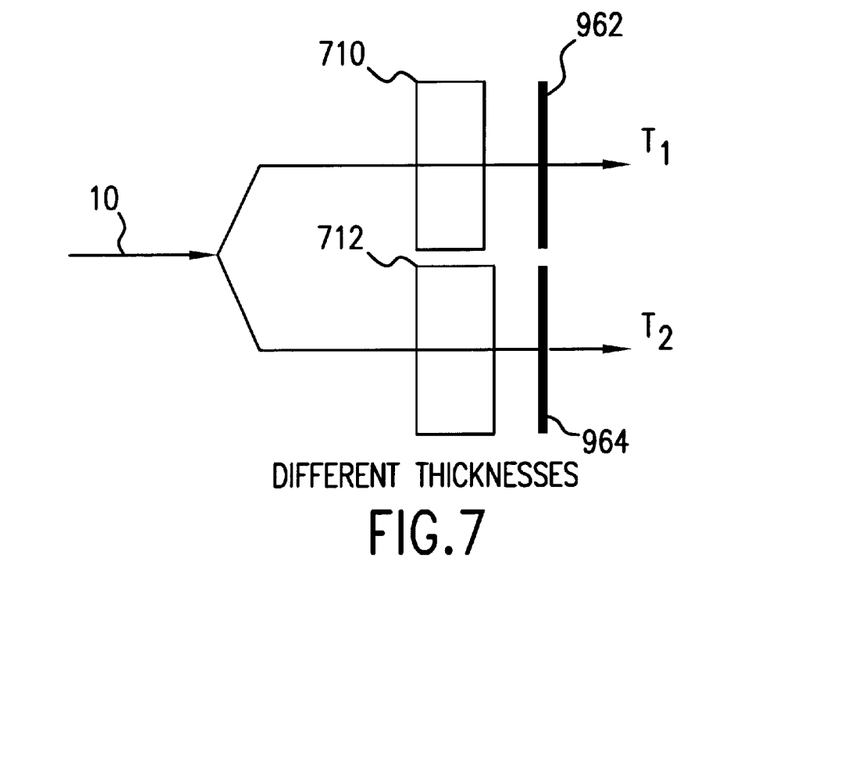
FIG. 7 is a block diagram showing a two filter, with different thicknesses, wavelength measurement system according to the present invention.

FIG. 7 is a schematic diagram illustrating another implementation of the wavelength measurement system of the present invention. This implementation uses two parallel waveplate blocks of birefringent material 710, 712. These blocks have different thicknesses relative to each other. The output beams pass through polarizers 962 and 964.

Figure 8:
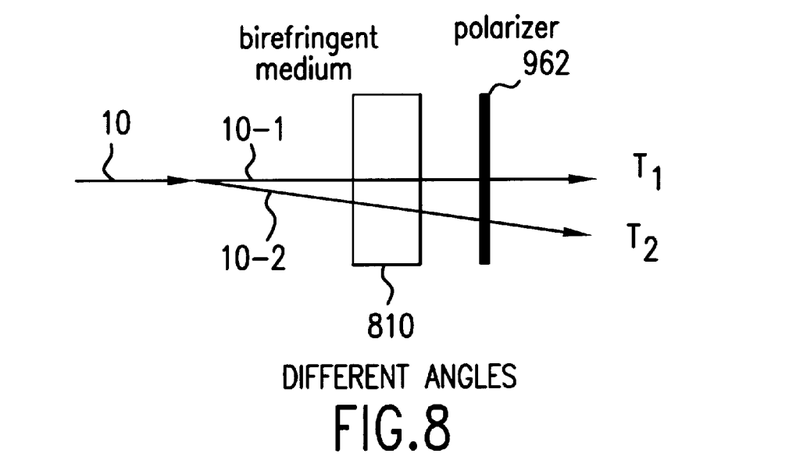
FIG. 8 is a block diagram showing a different angle wavelength measurement system.

As illustrated by FIG. 8, a similar net effect can be used if a beam splitter is placed in front of a single birefringent block 810 such that the input beam 10 is divided into two beams 10-1 and 10-2 that propagate through the birefringent block 810 at different angles and then through polarizer 962.

Figure 9:
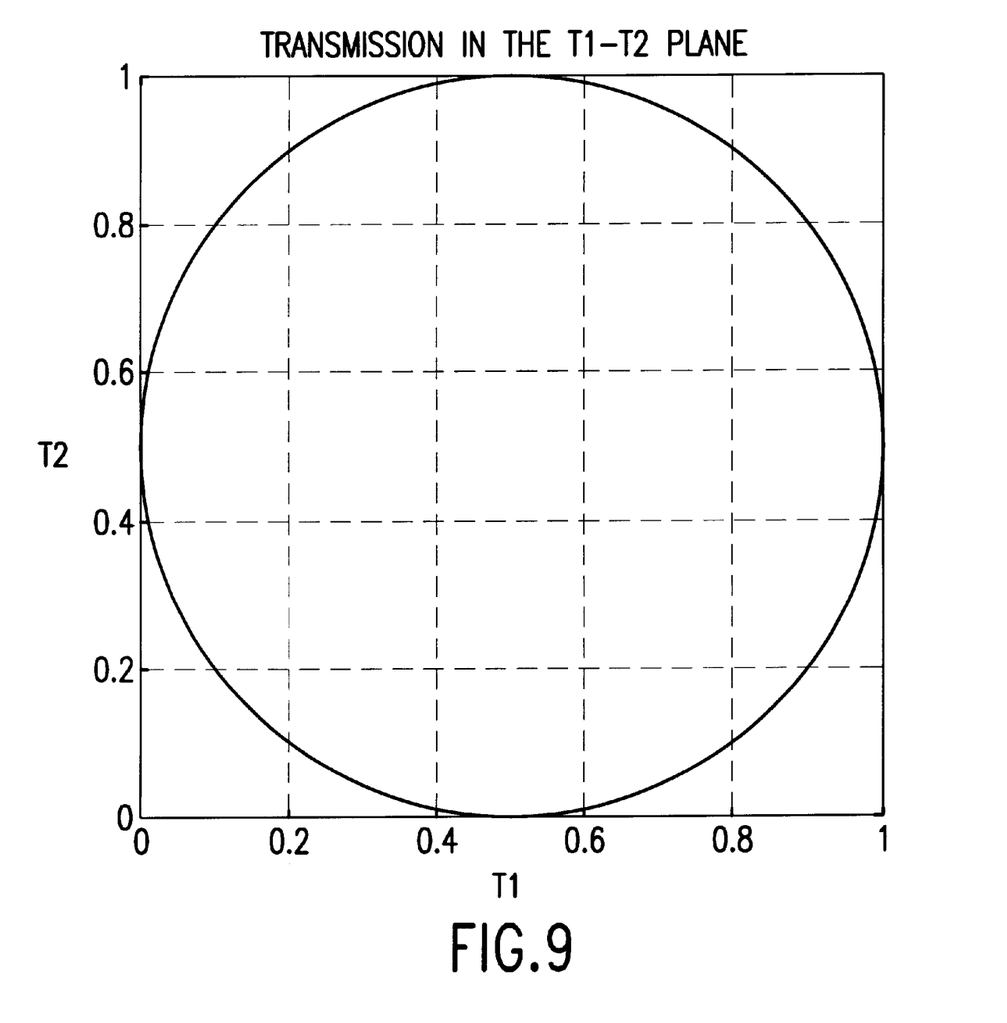
FIG. 9 is a plot in the $T_1$–$T_2$ plane of transmission variation with input optical frequency.

FIG. 9 shows the transmissions $T_1$ and $T_2$ plotted as points in the $T_1$-$T_2$ plane for varying input optical frequency. The point ($T_1$, $T_2$) traverses a circle in the plane as the input optical frequency is varied. The motion with input frequency variation is uniform, as a result, the additive frequency resolution of the system is stable across the free spectral range of the system.

Figure 10:
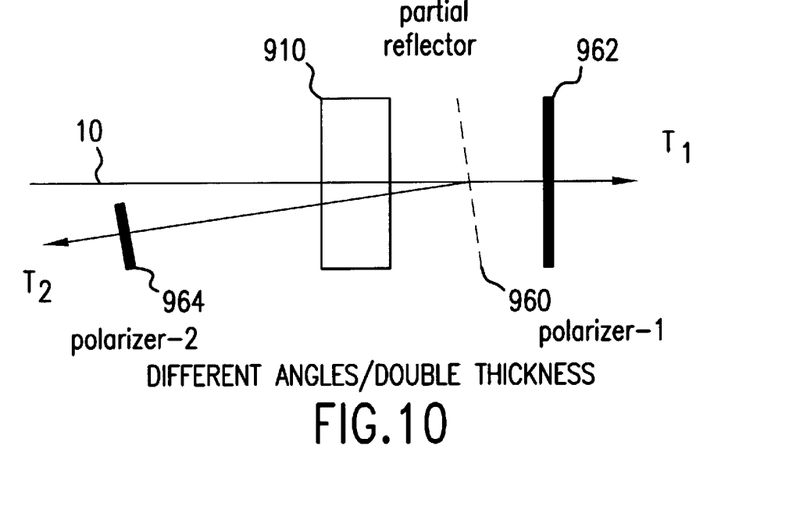
FIG. 10 is a block diagram showing a different angle/ double thickness version of the wavelength detection systems.

FIG. 10 shows still another embodiment where input beam 10 passes through a birefringent material block 910. A partial reflector 960 reflects a portion of the beam to be transmitted back through the birefringent block 910. Two polarizers 962, 964 are then used for the read-out discrimination.

Figure 11:
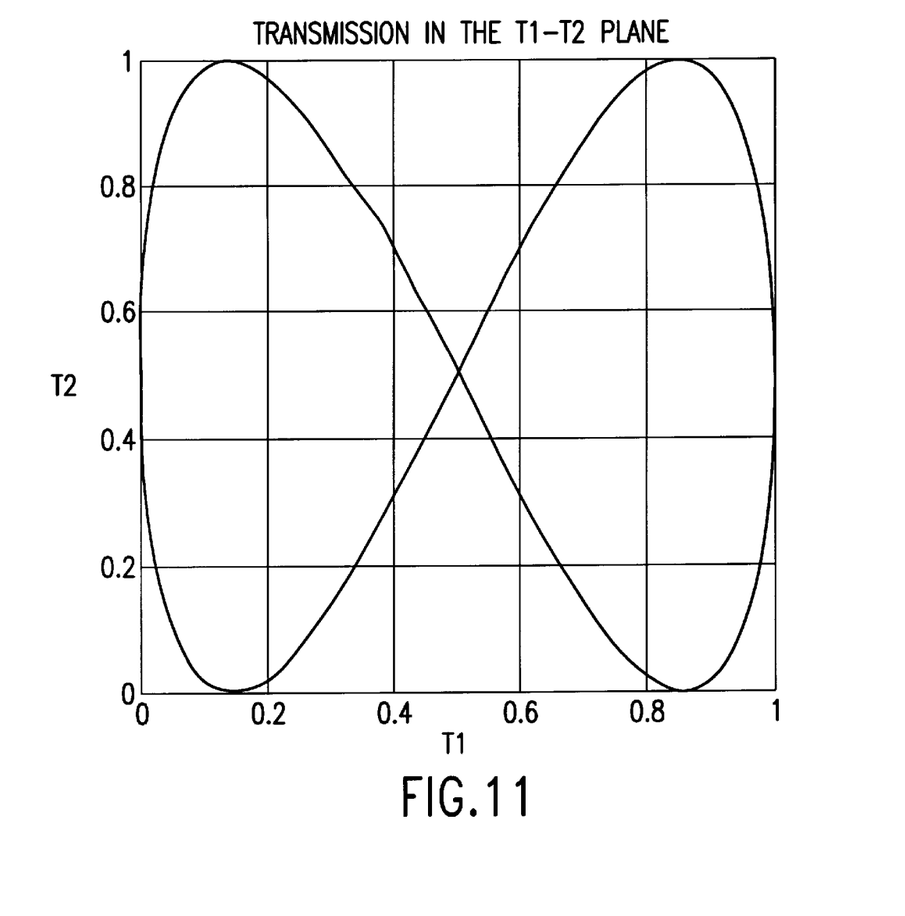
FIG. 11 is a plot in the $T_1$–$T_2$ plane of the transmission variation with input optical frequency for the FIG. 10 embodiment.

As illustrated by FIG. 11, the configuration of FIG. 10, while being relatively compact and requiring only a single block of birefringent material, displays a more complicated pattern in the $T_1$-$T_2$ plane (a Lissajous figure) and does not yield a stable additive wavelength resolution, however, as is associated with some of the preferred embodiments. Such device implementations with multiple filters and more complex patterns in the transmission plane, or more generally in a multi-dimensional transmission space, can nevertheless be useful for certain applications.

Figure 12:
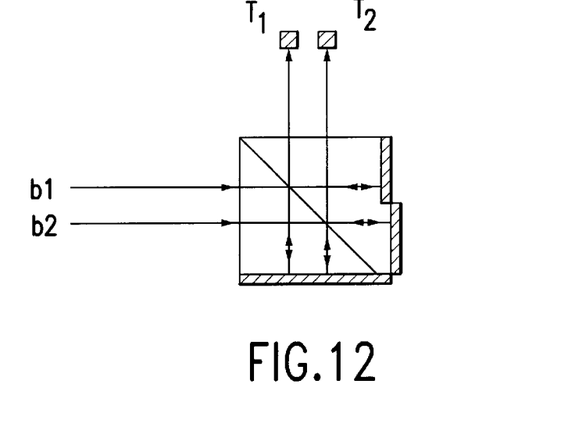
FIG. 12 is a schematic diagram of a Micheson interferometer implementation of the present invention.

FIG. 12 shows another possible implementation of the frequency meter. This is a Michelson interferometer with two probing beams b1 and b2 that see two different path length differences. The two transmission functions $T_1$ and $T_2$ are sinusoids shifted by a quarter period relative to each other; one can measure input optical frequency with a uniform frequency resolution from the circle in the $T_1$-$T_2$ plane. In fact, any interferometer that interferes two waves produces a sinusoidal frequency response; examples are Mach-Zehnder interferometer, Michelson interferometer, etc. The birefringent waveplate Lyot type filter we have used in our preferred implementations is in essence a single arm Mach-Zehnder interferometer where two orthogonal polarizations play the role of the two arms of the interferometer. A pair of any of such interferometers with approximately a quarter period frequency shift between the two, or an odd multiple of a quarter period, can give a frequency measurement with a uniform frequency resolution with no "dead zones".

Figure 13:
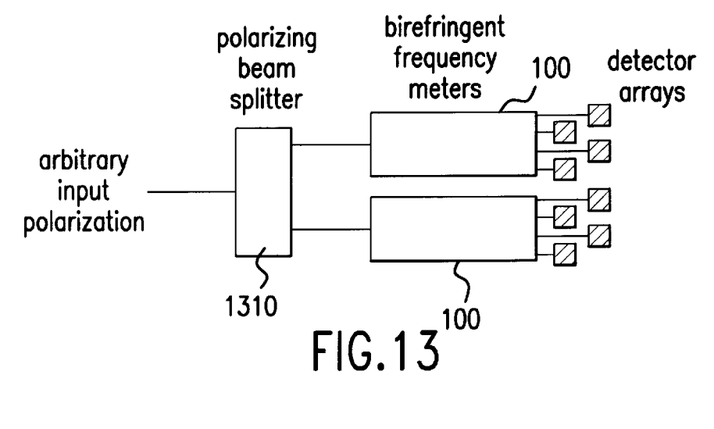
FIG. 13 is a block diagram of an input polarization-independent implementation of the present invention.

To obtain input-polarization-independent optical frequency measurement system, one can use two frequency meters, such as devices 100 shown in FIGS. 1A and 1B, in a polarization diversity scheme, as illustrated in FIG. 13. A polarizing beam splitter 1310 is used to generate the two beams for the two meters.

Figure 14:
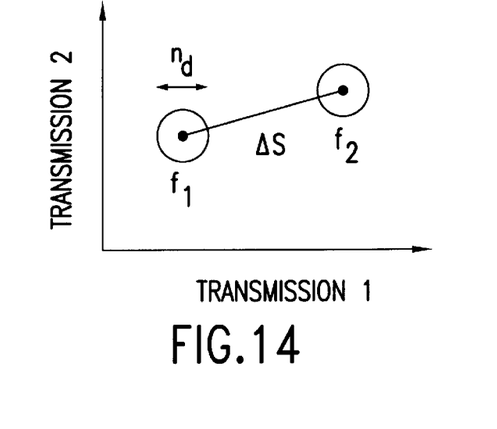
FIG. 14 is a plot in the transmission plane illustrating frequency resolution for the multiple filter optical frequency measurement.

We can give a simple estimate of the frequency resolution of the dual (or multiple) filter frequency measurement; FIG. 14 illustrates such frequency measurement. For an input optical frequency shift of $\Delta f = f_2 - f_1$, the point in the $T_1$-$T_2$ transmission plane shifts by a distance $\Delta s$:

$$\Delta s = \sum_{i=1}^{i=N=2} \sqrt{\Delta T_i^2} = \sqrt{\Delta T_1^2 + \Delta T_2^2}$$

This can be easily generalized from a two- to an N-filter (N>2) frequency measurement with a point moving in the $(T_1, T_2, \ldots T_N)$ transmission space. The effective "slope" of the frequency discriminator function with respect to input optical frequency f is $$ds/df = \sqrt{\sum_{i=1}^{N} (dT_i/df)^2}$$

The detector noise level $n_d$ in the transmission space is $$n_d = \frac{\sqrt{N}}{SNR}$$

where SNR is the electrical signal-to-noise ratio of an individual detector when the transmission $T_i$ is unity. We can resolve two optical frequencies if their corresponding points in the transmission space are separated by a distance $\Delta s$ of $n_d$ or greater; thus the frequency resolution $\Delta f_{res}$ is $$\Delta f_{res} = \frac{n_d}{ds/df} = \frac{\sqrt{N}/SNR}{\sqrt{\sum_{i=1}^{N}(dT_i/df)^2}}$$

For a dual filter frequency measurement, where individual filter responses are sinusoidal and phase shifted by a quarter period, the frequency discriminator slope is $$ds/df = \sqrt{(dT_1/df)^2 + (dT_2/df)^2} =$$
$$\sqrt{\left(\frac{2\pi}{f_{FSR}}\right)^2 [\sin^2(2\pi f/f_{FSR}) + \cos^2(2\pi f/f_{FSR})]} = \frac{2\pi}{f_{FSR}}$$

From this discriminator slope we obtain the dual filter frequency resolution function:

$$\Delta f_{res} = \frac{f_{FSR}}{SNR \cdot \pi\sqrt{2}}$$

The frequency resolution function $\Delta f_{res}$ is constant, independent of the input optical frequency, and is determined by the free spectral range $f_{FSR}$ of the filters and the constant signal-to-noise ratio SNR of the individual detector peak signals. This stable spectral resolution is an important advantage of the proposed frequency measurement system.

Also, in other embodiments, a compound optical frequency meter is constructed with a larger number of resolvable frequencies by using two or more of the proposed frequency measurement devices, such as those shown in FIG. 1. For example one device has a wide free spectral range and correspondingly a coarse frequency resolution and one device has a narrow free spectral range and correspondingly a fine frequency resolution. Such a compound frequency meter resolves a number of different optical frequencies that is given by the product of the numbers of resolvable frequencies of its constituent frequency meters. For example, such a compound frequency meter can be used to obtain a wider period or range of frequency measurement while keeping the same absolute frequency resolution; alternatively, one can obtain a finer absolute frequency resolution for the same frequency measurement period or range.

While this invention has been particularly shown and described with references to preferred embodiments thereof, it will be understood by those skilled in the art that various changes in form and details may be made therein without departing from the scope of the invention encompassed by the appended claims.

What is claimed is:

1. A wavelength detection system, comprising
   a birefringent filter system that applies multiple spectral filtering characteristics to an input beam;
   multiple detectors for detecting the beam after being filtered by the multiple spectral filtering characteristics; and
   a controller that determines wavelength of the input beam in response to the relative responses of the multiple detectors.

2. A system as claimed in claim 1, wherein the birefringent filter system comprises birefringent material.

3. A system as claimed in claim 1, wherein the birefringent filter system comprises a birefringent waveplate placed between two birefringent blocks.

4. A system as claimed in claim 1, wherein the birefringent filter system comprises two parallel waveplates placed between two birefringent material blocks.

5. A system as claimed in claim 1, wherein a diameter of the input beam is less than 400 $\mu$m.

6. A system as claimed in claim 1, wherein a diameter of the input beam is less than 150 $\mu$m.

7. A system as claimed in claim 1, wherein the length of the birefringent filter system is less than 20 mm.

8. A system as claimed in claim 1, wherein the controller modulates a wavelength of a semiconductor laser system in response to differences in magnitudes of the beams detected by the multiple detectors.

9. A semiconductor laser system with wavelength control, the system comprising:
   a semiconductor laser system that generates a polarized output beam;
   a wavelength detection system, comprising
      a birefringent filter system that applies multiple spectral filtering characteristics to an input beam from the laser system; and
      multiple detectors for detecting the beam after being filtered by the multiple spectral filtering characteristics; and
   a controller that modulates a wavelength of operation of the semiconductor laser system in response to the relative responses of the multiple detectors.

10. A system as claimed in claim 9, further comprising a beam splitter outside of a laser cavity of the semiconductor laser system that provides a portion of the output of the laser system as the beam received by the differential wavelength filter system.

11. A wavelength detection system, comprising
   a filter system that applies multiple spectral filtering characteristics to an input beam, the multiple spectral filtering characteristics jointly have a substantially stable spectral resolution;
   multiple detectors for detecting the beam after being filtered by the multiple spectral filtering characteristics; and
   a controller that determines wavelength of the input beam in response to the relative responses of the multiple detectors.

12. A wavelength detection system as claimed in claim 11, wherein the range of interest is a free spectral range of the filter system.

13. A system as claimed in claim 11, wherein the filter system comprises birefringent material.

14. A system as claimed in claim 11, wherein the filter system comprises a waveplate placed between two birefringent blocks.

15. A system as claimed in claim 11, wherein the filter system comprises two parallel waveplates placed between two birefringent material blocks.

16. A system as claimed in claim 11, wherein a diameter of the input beam is less than 400 $\mu$m.

17. A system as claimed in claim 11, wherein a diameter of the input beam is less than 150 $\mu$m.

18. A method for measuring wavelength of an input beam, the method comprising
   transmitting the input beam through birefringent material;
   transmitting the input beam through two different waveplates;
   transmitting the input beam through birefringent material again;
   detecting the intensity of multiple beams resulting from the input beam; and determining a wavelength of the input beam by reference to the intensities of the multiple beams.

19. A wavelength detection system, comprising an interferometric filter system that applies multiple sinusoidal spectral filtering characteristics to an input beam;

multiple detectors for detecting the beam after being filtered by the multiple spectral filtering characteristics; and a controller that determines wavelength of the input beam in response to the relative responses of the multiple detectors.

20. A system as claimed in claim 19, wherein the filter system comprises an interferometer.

21. A system as claimed in claim 20, wherein the interferometer is a multiple arm inferometer.

22. A system as claimed in claim 20, wherein the interferometer is a single arm interferometer including birefringent material.

23. A system as claimed in claim 19, wherein the filter system comprises a beam splitter.

24. A system as claimed in claim 19, wherein the filtering system wherein the beam splitter comprises birefringent material.

25. A system as claimed in claim 19, wherein the filter system comprises two birefringent beam splitters with intervening waveplates.

* * * * *